United States Patent
Lee

(10) Patent No.: US 9,107,240 B2
(45) Date of Patent: Aug. 11, 2015

(54) AMPLIFIER SUPPORTING MULTI MODE AND AMPLIFYING METHOD THEREOF

(75) Inventor: Jong Hyun Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 182 days.

(21) Appl. No.: 13/811,115

(22) PCT Filed: Aug. 4, 2011

(86) PCT No.: PCT/KR2011/005721
§ 371 (c)(1),
(2), (4) Date: Jan. 18, 2013

(87) PCT Pub. No.: WO2012/018233
PCT Pub. Date: Feb. 9, 2012

(65) Prior Publication Data
US 2013/0114471 A1 May 9, 2013

(30) Foreign Application Priority Data

Aug. 4, 2010 (KR) .................. 10-2010-0075333

(51) Int. Cl.
| | |
|---|---|
| H04L 5/14 | (2006.01) |
| H04W 88/06 | (2009.01) |
| H03F 1/02 | (2006.01) |
| H03F 3/189 | (2006.01) |
| H03F 3/24 | (2006.01) |

(52) U.S. Cl.
CPC ............. H04W 88/06 (2013.01); H03F 1/0261 (2013.01); H03F 3/189 (2013.01); H03F 3/24 (2013.01); H04L 5/14 (2013.01); *H03F 2200/18* (2013.01); *H03F 2200/294* (2013.01); *H03F 2200/408* (2013.01)

(58) Field of Classification Search
None
See application file for complete search history.

(56) References Cited

U.S. PATENT DOCUMENTS

| | | | | |
|---|---|---|---|---|
| 5,553,317 | A | * | 9/1996 | Hara ............................. 370/206 |
| 5,881,369 | A | * | 3/1999 | Dean et al. ...................... 455/78 |
| 5,889,814 | A | | 3/1999 | Simmons |
| 5,903,820 | A | | 5/1999 | Hagstrom |
| 6,185,434 | B1 | | 2/2001 | Hagstrom et al. |
| 7,142,884 | B2 | * | 11/2006 | Hagn ......................... 455/552.1 |
| 7,180,367 | B2 | * | 2/2007 | Woods et al. ................. 330/133 |
| 7,660,564 | B2 | * | 2/2010 | Lee ............................ 455/127.1 |
| 2001/0021178 | A1 | | 9/2001 | Barabash et al. |
| 2006/0035600 | A1 | * | 2/2006 | Lee et al. ......................... 455/78 |
| 2008/0186094 | A1 | * | 8/2008 | Lee ................................ 330/131 |
| 2010/0128644 | A1 | * | 5/2010 | Shibuya et al. ............... 370/280 |

OTHER PUBLICATIONS

PCT/ISA/237 Written Opinion issued on PCT/KR2011/005721 (pp. 4), Jan. 13, 2012.
PCT/ISA/210 Search Report issued on PCT/KR2011/005721 (pp. 3), Jan. 13, 2012.
Gryglewski, Daniel et al., Transverters for TDD and FDD ISM 2.4GHz Radio Systems, Instytut of Radioelectronics, Warsaw University of Technology, ul. Nowowiejska 15/19, 00-665 Warsaw, Poland (pp. 4), May 22, 2006.

* cited by examiner

*Primary Examiner* — Hassan Kizou
*Assistant Examiner* — Tejis Daya
(74) *Attorney, Agent, or Firm* — The Farrell Law Firm, P.C.

(57) ABSTRACT

An amplifier and an amplifying method are provided. The amplifier includes: an amplifying unit amplifying and transferring a transmission target signal to a TDD switch; the TDD switch transferring a signal received from the amplifying unit to a filter unit when the amplifier operates in a TDD mode, and transferring a signal received from the filter unit to a duplex mode selection switch; the duplex mode selection switch transferring a signal received from the filter unit to a receiving side; and a controller controlling the duplex mode selection switch to transfer the signal received from the filter unit to the receiving side without passing through the TDD switch when the received duplex mode selection signal is a FDD mode selection signal.

16 Claims, 8 Drawing Sheets

[Fig. 2]

AMPLIFIER SUPPORTING MULTI MODE AND AMPLIFYING METHOD THEREOF

TECHNICAL FIELD

The present invention relates to an amplifier supporting a multi mode and an amplifying method thereof, and more particularly, to an amplifier supporting both of a Time Division Duplex (TDD) mode and a Frequency Division Duplex (FDD) mode, and an amplifying method thereof.

BACKGROUND ART

A pre-drive amplifier, a drive amplifier, and a main amplifier of a High Power Amplifier (HPA) in Long Time Evolution (LTE) communication and WiMax-FDD system receive and amplify a gate bias, and the gate bias is always applied regardless of time to continuously operation the HPA. Accordingly, the HPA continuously amplifies a signal in a transmission Tx mode, the amplified signal passes through a Band-Pass Filter (BPF) and then transmitted to an antenna Ant. This is why a frequency band of a transmission Tx mode and a frequency band of a receiving Rx mode differ from each other in a general FDD communication system.

However, the frequency band of a transmission Tx mode and the frequency band of a receiving Rx mode differ from each other in a TDD system such as WiMax and TD-LTE systems. Because the frequency band of a transmission Tx mode and the frequency band of a receiving Rx mode are the same in communication using a TDD mode, if an HPA always operates in a TDD communication system, great Tx leakage noise occurs. Accordingly, in a receiving Rx mode, this reduces a receiving Signal-to-Noise Ratio (SNR). For this reason, a switch of relatively high capacity is used at an output terminal of the HPA. However, since an RF communication switch S/W of high capacity has a very high cost and limitation in capacity, a simple RF S/W of high capacity is used.

A high output amplifier operates in a Tx mode using Gate bias on/off technology of an HPA but an operation of the high output amplifier is restricted in a Rx mode in a currently used TDD system. Owing to use of such modes, a Tx leakage noise level may be reduced less than −100 dBm and does not influence a receiving SNR characteristic degradation in a Rx mode to stably perform mobile system communication.

It is difficult to use an HPA for an FDD system in the TDD system. Conversely, an HPA for the TDD system may not be used in the FDD system. However, both of the HPA for an FDD system and the HPA for the TDD system are used in a recent system such as a recently developed LTE system and WiMax system in which the FDD and TDD systems coexist. Presently, the FDD system and the TDD system have been independently developed to increase a developing cost and human power twice. Moreover, due to a request of a business owner, if a system simultaneously using the two modes is needed, the two types of HPA should be provided and used, respectively.

In this case, price competitiveness and a space side of a system are very poor. First of all, rapid response to the request of the business owner is now required. To meet the requirements, because a new product should be again made in an existing mode, there is a need for much time and effort.

DISCLOSURE OF INVENTION

Technical Problem

The present invention has been made in view of the above problems, and provides an amplifier supporting both of a TDD mode and an FDD mode, and an amplifying method thereof.

Solution to Problem

In accordance with an aspect of the present invention, an amplifier includes: an amplifying unit amplifying and transferring a transmission target signal to a Time Division Duplex (TDD) switch; the TDD switch transferring a signal received from the amplifying unit to a filter unit when the amplifier operates in a TDD mode, and transferring a signal received from the filter unit to a duplex mode selection switch; the duplex mode selection switch transferring a signal received from the filter unit to a receiving side; and a controller receiving a duplex mode selection signal, controlling the duplex mode selection switch to transfer the signal received from the filter unit to the receiving side without passing through the TDD switch when the received duplex mode selection signal is a Frequency Division Duplex (FDD) mode selection signal, and to transfer the signal received from the filter unit to the receiving side through the TDD switch when the received duplex mode selection signal is a TDD mode selection signal.

In accordance with another aspect of the present invention, an amplifying method by an amplifier including an amplifying unit amplifying and transferring a transmission target signal to a Time Division Duplex (TDD) switch, and the TDD switch transferring a signal received from the amplifying unit to a filter unit when the amplifier operates in a TDD mode, and transferring a signal received from the filter unit to a duplex mode selection switch, includes: receiving a duplex mode selection signal from a system; connecting a receiving side with the filter unit when the received duplex mode selection signal is a Frequency Division Duplex (FDD) mode selection signal; and connecting the receiving side to the TDD switch when the received duplex mode selection signal is a TDD mode selection signal.

An embodiment of the present invention has an effect that may provide an amplifier supporting both of a TDD mode and an FDD mode, and an amplifying method thereof.

In an embodiment of the present invention, a cost, developing time, response time to a business owner can be significantly reduced in comparison with a conventional method that developed Respective HPAs. An embodiment of the present invention may support a variety of systems with the same module through common use to reduce manufacturing costs.

Advantageous Effects of Invention

A gate bias on/off scheme used by the present invention in a TDD mode may reduce total power consumption of a system to considerably increase an efficiency side, improve a receiving SNR of a receiving end, and protect an LNA and components of the receiving end. In a current system in which requirements of a user are very various, and rapid response is necessary, there is urgently needed for development of a module satisfying two modes, namely, both of FDD and TDD systems using a relatively simple method such as the present invention.

BRIEF DESCRIPTION OF DRAWINGS

The objects, features and advantages of the present invention will be more apparent from the following detailed description in conjunction with the accompanying drawings, in which.

MODE FOR THE INVENTION

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

Figure 1:
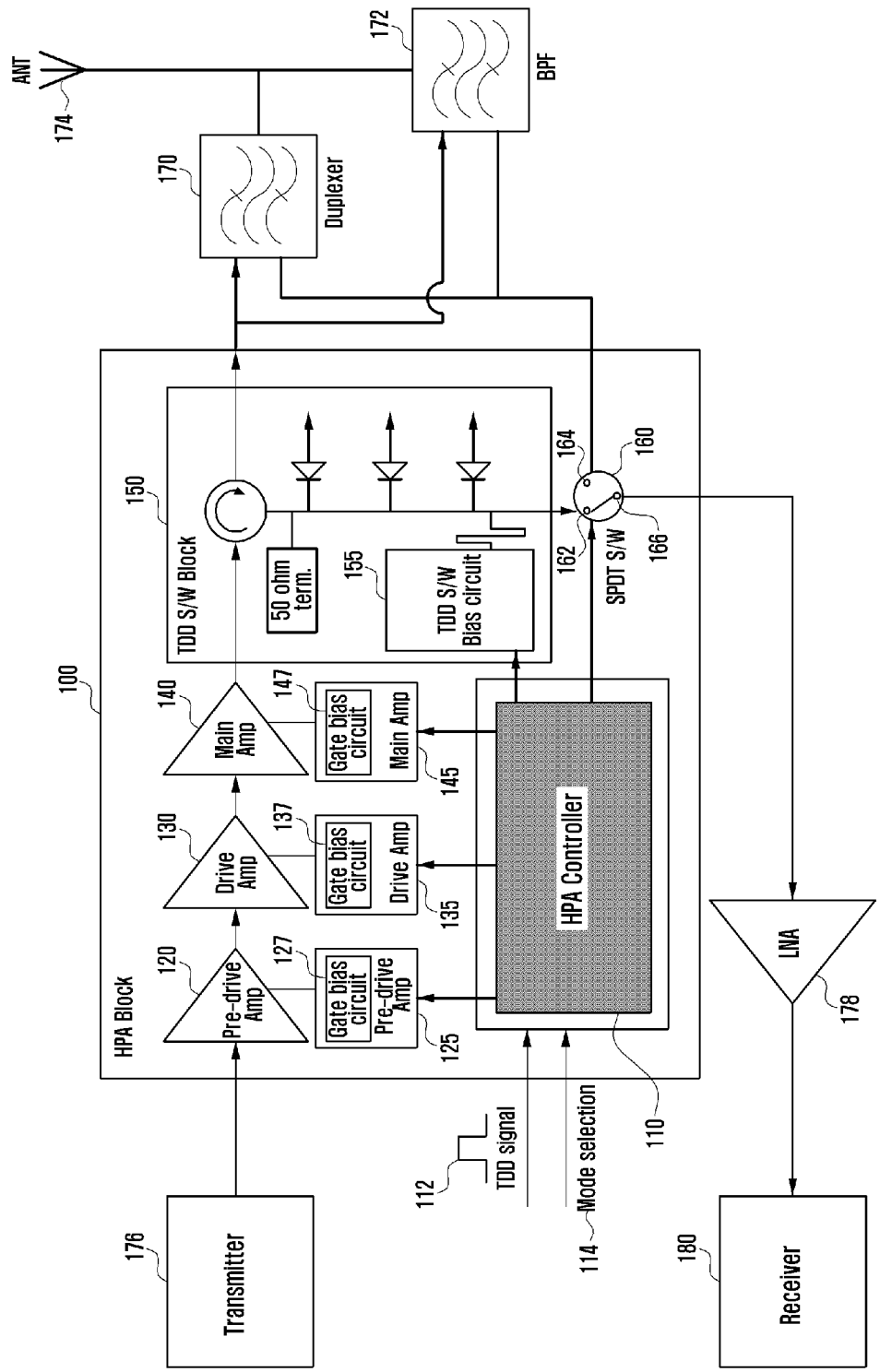
FIG. 1 is a block diagram illustrating a configuration of an amplifier according to an exemplary embodiment of the present invention.

FIG. 1 is a block diagram illustrating a configuration of an amplifier according to an exemplary embodiment of the present invention. The amplifier of FIG. 1 may be used in both of an FDD system and a TDD system. Here, a high power amplifier (referred to as HPA hereinafter) is described as an example of the amplifier.

Referring to FIG. 1, an HPA 100 includes an HPA controller 110 (referred to as controller hereinafter), a pre-drive amplifier 120, a drive amplifier 130, a main amplifier 140, a TDD switch 150, and a duplex mode selection switch 160. The HPA 100 further includes a pre-drive amplifier gate bias unit 125, a drive amplifier gate bias unit 135, and a main amplifier gate bias unit 145.

Here, the duplex mode selection switch 160 is used by a form of a Single Pole Double Throw Switch (SPDT). Hereinafter, without a separate description, SPDT switch or SPDT S/W refers to the duplex mode selection switch 160. Hereinafter, a dual mode refers to a communication mode such as FDD or TDD.

The HPA 100 receives and amplifies a transmission signal from a transmitter 176, and transfers the amplified transmission signal to an antenna 174 through a duplexer 170 or a band pass filter (BPF) 172. The antenna 174 converts a received signal into an electric wave and transfers the electric wave to another user. Further, if the antenna 174 receives the electric wave, it converts the received electric wave into an electric signal, and transfers the electric signal to the HPA 100 through the duplexer 170 or the BPF 172. The HPA 100 transfers the received electric signal to a receiver 180 through a Low-Noise Amplifier (LNA) 178.

A transmitter 176 converts a transmission target voice or other data into an electric signal, and transfers the converted electric signal to the HPA 100.

The LNA 178 is an amplifier designed by setting an operation point and a matching point to reduce a noise figure (NF), which has an NF of 1.5~2.5.

Power received by an RF receiving end has a very low power level due to attenuation and noise. For this reason, amplification is essential. Since the power is a signal having external much noise, first of all, there is a need for an amplifying function minimizing the noise.

The LNA 178 is the most fundamental amplifier of RF amplifiers. To obtain low noise characteristics, few heat noise elements such as transistors and resistors having low NF and low current should be used. Besides this, a maximal gain should be secured through conjugate matching.

The LNA 178 low-noise-amplifies a signal received from the HPA 100 and transfers the signal to the receiver 180.

The receiver 180 converts the amplified signal received from the LNA 178 into a voice or other data capable of being processed.

The duplexer 170 and the BPF 172 are complementarily used to each other. When the HPA 100 operates in an FDD mode, it exchanges signals with the antenna 174 through the duplexer 170. Meanwhile, the HPA 100 operates in a TDD mode, it exchanges signals with the antenna 174 through the BPF 172. To do this, the controller 110 may control an input/output switch to connect the HPA 100 with one of the duplexer 170 or the BPF 172 according to a duplex mode. That is, when the HPA 100 operates in an FDD mode, the controller 100 connects the HPA 100 to the duplexer 170. When the HPA 100 operates in a TDD mode, the controller 100 connects the HPA 100 to the BPF 172.

A structural element filtering signals between the antenna 174 and the HPA 100 refers to a filter unit. In an embodiment of FIG. 1, the filter unit includes a duplexer 170 and a BPF 172.

In accordance with an embodiment of the present invention, the filter unit may include one of the duplexer 170 or the BPF 172 or other filter. The filter unit may include a first filter suitable for filtering a signal of an FDD mode and a second filter suitable for filtering a signal of a TDD mode. In the meantime, the filters are selected according to a duplex mode of the HPA 100 as illustrated previously to perform a filtering operation.

The duplexer 170 is a unit used when both of transmission and reception are used using a single antenna in a system having different transmission and reception frequencies, which consists of three ports. A construction and an operation of the duplexer 170 are well known in the art, and thus a detailed description thereof is omitted.

The BPF 172 is a structural element filtering only a determined frequency band used in a system. A construction and an operation of the BPF 172 are well known in the art, and thus a detailed description thereof is omitted.

The antenna 174 refers to a device that radiates electromagnetic wave energy from a transmitter or induces air electromagnetic wave energy to a receiver. A construction and an operation of the antenna 174 are well known in the art, and thus a detailed description thereof is omitted.

The amplifying unit refers to a structural element such as a pre-drive amplifier 120, a drive amplifier 130, or a main amplifier 140 practically amplifying a transmission target signal in the specification. Although the amplifying unit includes a pre-drive amplifier 120, a drive amplifier 130, and a main amplifier 140 in an embodiment of FIG. 1, it may include other amplifiers or only a part of the pre-drive amplifier 120, the drive amplifier 130, and the main amplifier 140.

In an embodiment of FIG. 1, the controller 110 controls gate bias units 125, 135, and 145 of the pre-drive amplifier 120, the drive amplifier 130, and the main amplifier 140 to control a TDD switch 150 and a duplex mode selection switch 160 according to a duplex mode (FDD or TDD). Accordingly, an HPA 100 may be used in both of an FDD mode and a TDD mode at need of a system.

In the FDD mode, the controller 110 supplies gate to source voltage in field effect transistors Vgs to the amplifiers 120, 130, and 140 such that the HPA 100 always operates. Further, the controller 110 may apply a predetermined Vgs by an experiment according to temperature to the amplifiers 120, 130, and 140 to obtain optimal performance according to temperature.

In the TDD mode, the controller 110 receives a TDD signal 112 from a system, and turns-on/off a Vgs value, provide it to the amplifiers 120, 130, and 140 such that an amplifying unit amplifies in only a transmission mode but does not operation in a receiving mode. During a transmission interval (maintaining time interval of transmission mode), a predetermined voltage according to temperature is applied to the amplifiers 120, 130, and 140 as the Vgs value to obtain optimal electric wave performance according to temperature. A TDD signal 112 indicating the transmission mode refers to a transmission mode signal, and a TDD signal indicating a receiving mode refers to a receiving mode signal.

The pre-drive amplifier 120 is a first stage of a High Power Amplifier Unit (HPAU), which amplifies low RF power of several dBm level. The pre-drive amplifier 120 uses a gain block of various stages and has a very high entire gain. The pre-drive amplifier 120 amplifies and transfers a signal from the transmitter 176 to a drive amplifier 130.

The driver amplifier 130 is an intermediate stage of the HPA, which amplifies intermediate RF power less than 5 W level. Linearity is an important factor in the drive amplifier 130, and the drive amplifier 130 has a gain of 20 dB. The drive amplifier 130 amplifies and transfers a signal from the pre-drive amplifier 120 to the main amplifier 140.

The main amplifier 140 is a final stage of the HPAU, which amplifies high RF power greater than 20 W. An amount of current consumption is great to generate large heat. The main amplifier 140 amplifies and transfers a signal from the drive amplifier 130 to a TDD switch 150.

The amplifiers 120, 130, and 140 connect with gate bias units 125, 135, and 145, respectively. The gate bias units 125, 135, and 145 include gate bias circuits 127, 137, and 147, respectively. The controller 110 applies a bias voltage to gate bias circuits 127, 137, and 147 of gate bias units 125, 135, and 145 to control the amplifiers 120, 130, and 140, respectively.

The duplex mode selection switch 160 switches an LNA path to form a receiving Rx path necessary according to a duplex mode. In an embodiment of the present invention, as illustrated above, the duplex mode selection switch 160 is implemented by an SPDT switch. Here, one terminal 166 of the duplex mode selection switch 160 connected to the LNA 178 connects with one of another terminal 164 connected to the duplexer 170 or the other terminal 162 connected to the TDD switch 150 according to a duplex mode.

In an FDD mode, the duplex mode selection switch 160 is switched to a duplexer 170 of an output stage. That is, the duplex mode selection switch 160 connects one terminal 166 of the duplex mode selection switch 160 connected to the LNA 178 to another terminal 164 connected to the duplexer 170. Accordingly, a receiving signal output from the duplexer 170 may be transferred to a receiver 180 through an LNA 178 regardless of the TDD switch 150.

In the TDD mode, the duplex mode selection switch 160 connects the one terminal 166 connected with the LNA 178 to the other end 162 connected with the TDD switch 150. Accordingly, a receiving signal output from the BPF 172 may be transferred to the receiver 180 through the TDD switch 150 and the LNA 178.

In a transmission mode of the TDD mode, the TDD switch 150 is switched to a 50 ohm term path to function as an isolation role. At this time, the TDD switch 150 secures isolation between Tx LNA 178 greater than 60 dB not to provide output power to the LNA 178. Such an operation may stably protect the LNA 178.

In a receiving mode of the TDD mode, the TDD switch 150 opens a path between Rx LNA 178 such that the LNA 178 may readily receive the received signal.

Further, in a receiving mode, gate biases of the pre-drive amplifier 110, the drive-amplifier 120, and the main amplifier 130 maintain an off state to cut-off Tx noise to be induced to the LNA 178.

The controller 110 controls operations of the foregoing TDD switch 150, the amplifying unit, and the duplex mode selection switch 160 according to a TDD control signal 112 and a duplex mode selection signal 114 received from a system. As a result, the present invention provides a structure of an HPA capable of using both of an FDD system and a TDD system by simply substituting a simple hardware, namely, substitution of the duplexer 170 and the BPF 172.

The controller 110 applies on/off gate bias to the pre-drive amplifier 120, the drive amplifier 130, and the main amplifier 140 according to a duplex mode that enables the HPA 100 to operate suited to the duplex mode (TDD or FDD). At this time, the applied gate bias may be a voltage controlled by the controller to obtain optimal performance according to temperature.

When the HPA 100 operates in the FDD system, a preset gate bias is continuously supplied to the pre-drive amplifier 120, the drive amplifier 130, and the main amplifier 140. Here, there is little electric current flowing in the gate bias, and a gate bias used in a high power transistor for the drive amplifier 130 and the main amplifier 140 may be less than 5V. When Gallium arsenide (GaAs) or Gallium nitride (GaN) is used, a gate bias of −5V~0V may be used.

A duplex mode selection switch 160 of a receiving end switches the TDD switch 150 and the duplexer 170 according to duplex mode control of a system such that the LNA 178 may easily receive a received signal in TDD and FDD operations.

Further, the TDD switch 150 cuts-off a path to the LNA 178 in an FDD mode to secure isolation but opens a 50 ohm term path such that the system is not damaged in an abnormal case where the antenna 174 is broken. When the switch 150 operates in a TDD mode, the TDD switch 150 cuts-off a path of the transmission signal to the LNA 178 in a transmission mode to secure isolation between Tx LNA 178 but opens a path of the received signal to the LNA 178 that enables the received signal to easily pass. At this time, the duplex mode selection switch 160 is switched to a direction of the TDD switch 150.

Operations in a TDD mode and an FDD mode will be described with reference to FIG. 3 and FIG. 4 in detail.

In the description referring to FIG. 1, the LNA 178 is located between the receiver 180 and the duplex mode selection switch 160, and performs a filtering operation. Accordingly, the foregoing embodiment has illustrated that the duplex mode selection switch 160 connects with the LNA 178. However, in an embodiment of the present invention, when the LNA 178 is not needed in a construction of a communication device, the duplex mode selection switch 160 may directly connect with the receiver 180 or connect with another filter. The LNA 178, another filter, and the receiver 180 are called a receiving side. Hereinafter, for convenience, it is assumed that a signal from the duplex mode selection switch 160 is transferred to the receiving side through the LNA 178.

Figure 2:
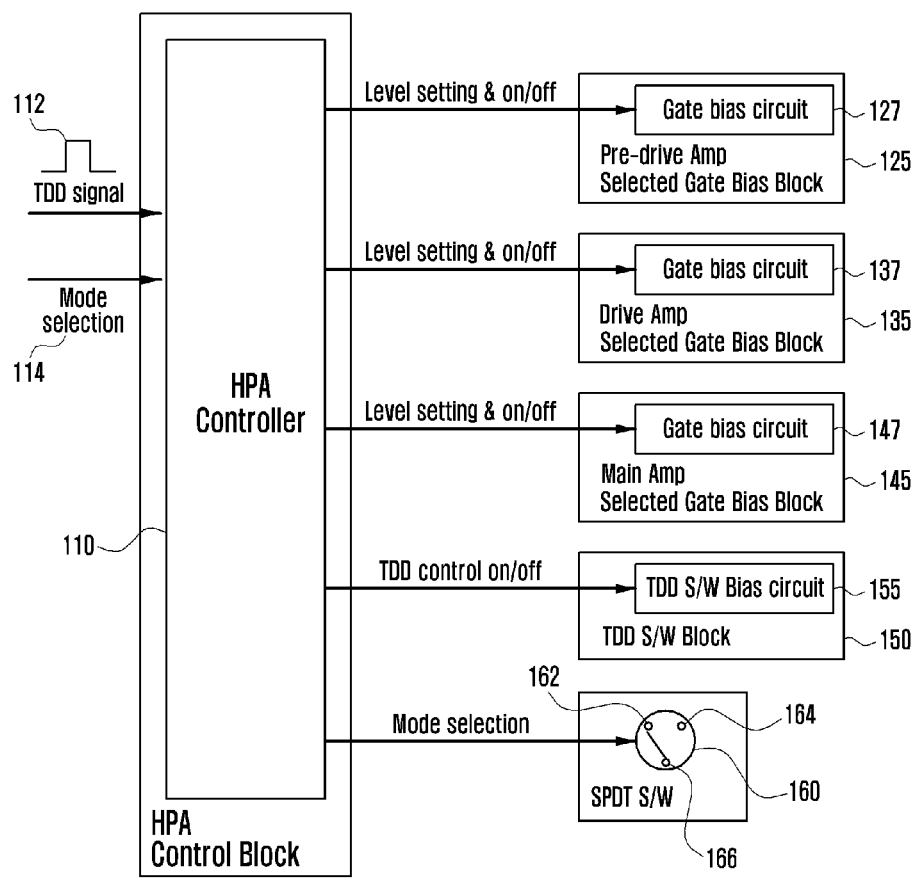
FIG. 2 is a detailed block diagram illustrating an HPA shown in FIG. 1.

FIG. 2 is a detailed block diagram illustrating an HPA shown in FIG. 1. In a system, Tx on/off signals being a duplex mode selection signal 114 and a TDD signal 112 are transmitted to the controller 110.

The controller 110 applies gate biases of the pre-drive amplifier 120, the drive-amplifier 130, and the main amplifier 140 according to a duplex mode selection signal. At this time, Gate biases by modes are a Vgs value to which a compensation value according to temperature is applied. Furthermore, the controller 110 supplies an on/off signal controlling the TDD switch bias circuit 155 the to the TDD switch 150 according to a duplex mode selection signal to operate the TDD switch 150. A duplex mode selection switch 160 switches the TDD switch 162 or the duplexer 170 according to a duplex mode to determine a path of a received signal input to the LNA 178. Accordingly, an RF path capable of simultaneously supporting FDD and TDD systems may be formed.

The controller 110 may implement a function using a conventional controller without additional circuits and without adding a cost. The conventional controller is a structural element detects a fact when a damage factor of an HPA 100 such as enable and disable of an HPA 100, overpower, high temperature occurs and transferring shutdown of the HPA 100 and a start alarm message to a system.

The TDD control signal 112 or TDD signal 112 received from a system by the controller 110 uses transistor-transistor logic (TTL) signal or a Low-voltage TTL (LVTTL) signal. However, when a distance between structural elements is farther, the TTL signal is converted into low voltage differential signaling (LVDS) and the LVDS is transmitted. The LVDS is more robust to external noise than an LVTTL. Although the LVDS is weak within 200 mV, it may be restored without error to be widely used. The HPA 100 receives the TDD signal 112 and transfers the received TDD signal 112 to a controller 110 of the HPA 100. The controller 110 receives a duplex mode signal (determined according to duplex mode selection signal 114) of a currently operated system and a TDD signal 112, and applies necessary gate biases to the pre-drive amplifier 120, the drive amplifier 130, and the main amplifier 140, respectively. In addition, in a TDD mode, the HPA 100 supplies the gate biases to the amplifiers 120, 130, and 140 only during a Tx interval according to the TDD signal 112 such that the HPA 100 operates in the TDD mode.

Since operation speeds of the pre-drive amplifier 120, the drive amplifier 130, and the main amplifier 140 are less than several tens ns, it is a smaller value that of the TDD signal being ms unit, with the result that an operation in the TDD mode is possible. Because the TDD switch 150 also has a short operation time, it may be used. In general, the TDD switch 150 has on/off time less than approximately 10 s, and accordingly a Tx signal and an Rx signal are independently operated not to overlap with each other in TDD communication using one frequency.

Figure 3:
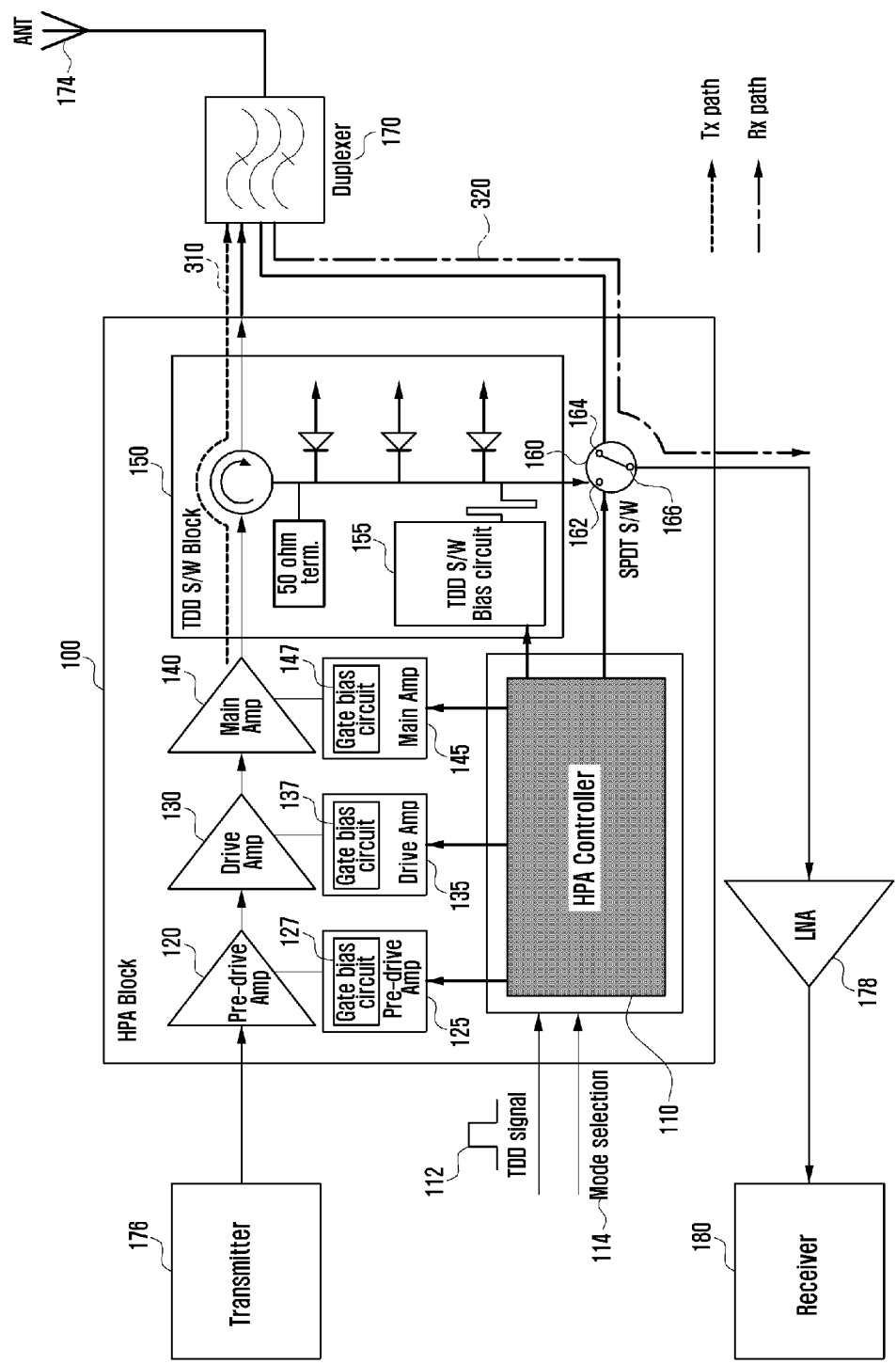
FIG. 3 is a block diagram illustrating flow of a transmission signal and a received signal when applying an FDD mode during an operation of the HPA shown in FIG. 1.

FIG. 3 is a block diagram illustrating flow of a transmission signal and a received signal when applying an FDD mode during an operation of the HPA 100 shown in FIG. 1.

The controller 110 receives an FDD mode selection signal from a system as the duplex mode selection signal 114, and accordingly controls other structural elements suited to the FDD mode. In this case, the TDD signal 112 is not applied. The controller 110 supplies predetermined gate biases to the pre-drive amplifier 120, the drive amplifier 130, and the main amplifier 140, respectively, and the gate biases always have a constant Vgs value regardless of time. This is because respective amplifiers 120, 130, and 140 constituting the HPA 100 should always operate in the FDD mode.

If temperature of the HPA 100 changes during operation, the controller 110 applies a gate bias optimal to a corresponding temperature to bias circuits 127, 137, and 147 of the respective amplifiers 120, 130, and 140 based on a sensed temperature to perform a temperature compensation operation. The respective amplifiers 120, 130, and 140 may have optimal RF performance due to the operation, and perform the operation without additional temperature compensation circuits. Values determined by an experiment are stored in a form similar to a table as gate biases optimal to respective temperatures. Subsequently, a gate bias corresponding to a sensed temperature upon applying the gate bias may be extracted and used from the table.

A bias is supplied to a pin diode of the TDD switch 150 to perform the same operation as that of an isolator. If this is performed, when an antenna port is damaged or a problem occurs in a transmission line to unchangedly return transmission Tx power, a signal may be induced to a mounted 50 ohm term path to stably protect the HPA 100.

The duplex mode selection switch may switch the duplexer 170 mounted at an output end and an LNA port to transfer an Rx signal to the LNA 178. Accordingly, the received signal from the duplexer is directly transferred to the LNA 178 through the duplex mode selection switch 160.

The following is a control method of the controller 110 in an FDD mode. The amplifiers 120, 130, and 140 always operate, and the TDD switch 150 is controlled to transfer a signal from the main amplifier 140 to the duplexer 170. Such control forms a transmission path 310.

Moreover, the duplex mode selection switch 160 connects the duplexer 170 to the LNA 178. Such control creates a receiving path 320.

Figure 4:
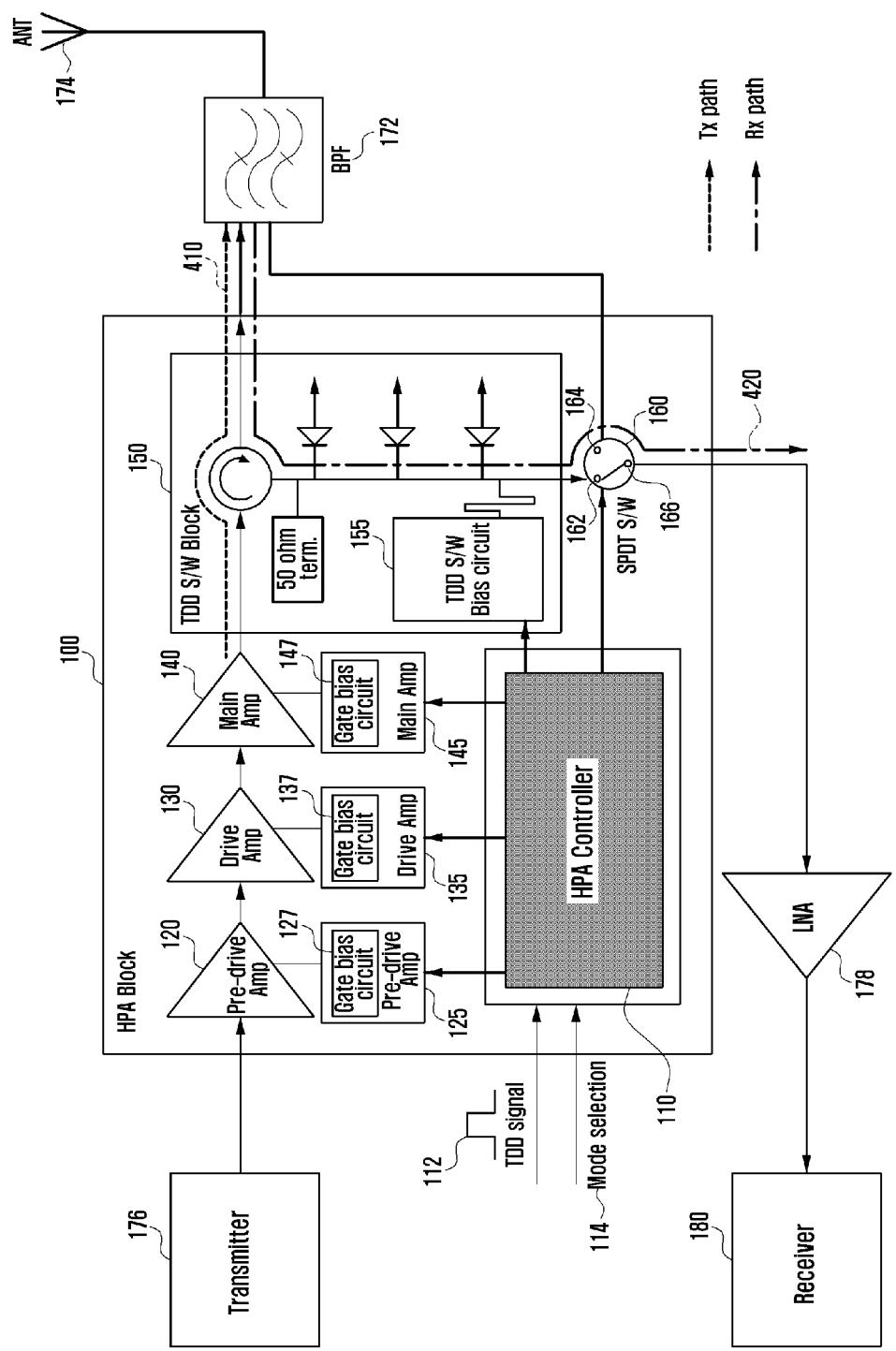
FIG. 4 is a block diagram illustrating flow of a transmission signal and a received signal when applying a TDD mode during an operation of the HPA shown in FIG. 1.

FIG. 4 is a block diagram illustrating flow of a transmission signal and a received signal when applying a TDD mode during an operation of the HPA 100 shown in FIG. 1.

The controller 110 receives a TDD mode selection signal from a system as the duplex mode selection signal 114, and accordingly controls other structural elements suited to the TDD mode.

In the TDD mode, the controller 110 receives a TDD signal 112 from the system, and applies gate biases to the pre-drive amplifier 120, the drive amplifier 130, and the main amplifier 140 of the HPA 100, respectively. At this time, Vgs values are gate biases adjusted by sensing temperature of the HPA 100 to obtain optimal performance.

In a transmission mode, the controller 110 applies a gate bias of approximately 2V~3V to respective amplifiers 120, 130, and 140, such that the amplifiers 120, 130, and 140 amplify the signal and transmit the amplified signal to an antenna 174 through a TDD switch 150 and a BPF 172. In general, when the HPA 100 is configured by a transistor of a Field effect transistor (FET) system such as a laterally diffused metal oxide semiconductor (LDMOS), a gate bias has a voltage of approximately 2V~3V. When the HPA 100 is configured by a device such as GaAs and a currently interested GaN, the gate bias has several negative voltages. The controller 110 applies a voltage to a pin diode of a TDD switch 150 in the transmission mode to secure isolation between Tx LNA 178. When the antenna 174 is broken or all transmission signals are reflected and returned because of the occurrence of a problem in a transmission path 410, a signal is induced to be introduced to a mounted 50 ohm term path to prevent the damage of the HPA 100.

In a receiving mode, the controller 110 sets gate biases applied to the respective amplifiers 120, 130, and 140 to an off state. Accordingly, the respective amplifiers 120, 130, and 140 can no longer amplify the transmission signal such that a received signal may be easily input to the LNA 178. There is no transmission signal applied to the HPA 100 in the system during a receiving mode interval. In a receiving mode, the controller 110 does not apply a bias to a pin diode such that the received signal may be freely input to the TDD switch 150. The duplex mode selection switch 160 connects the switch 150 to the LNA 178 to form a receiving path 420 such that the received signal from the antenna 174 is input to a TDD switch 150 through the BPF 172 and then transferred to the LNA 178. The LNA 178 amplifies and transfers a received signal to the receiver 180.

When turning-on/off the pre-drive amplifier 120 during a TDD operation, the drive-amplifier 130, and the main amplifier 140 of the HPA 100, a TDD system using the same frequency may significantly reduce transmission Tx leakage noise level in a receiving mode. Here, an on/off time of the gate bias is a very important factor. A transmission/receiving time used in the system is approximately ms unit. If the gate bias performs an on/off operation within a time very shorter than the transmission/receiving time, TDD communication is possible. A real on/off time of the gate bias is several ns unit. When the pre-drive amplifier 120, the drive amplifier 130, and the main amplifier 140 performing an amplifying operation is in a transmission mode, a time taken from receiving the gate bias to a normally amplifying operation is within 10 s. To do this, a capacitor such as tantalum capacitor or MultiLayer Ceramic Capacitor (MLCC) having a great reaction time should not be used in the gate bias line. Since a capacitance component greater than several s acts as a great delay value in a TDD on/off time, it may have a difficult in performing a normal on/off operation and not exactly transfer a transmission signal during a transmission interval to be practically transferred to cause communication trouble.

The following is an operation in a TDD mode. In the TDD mode, the controller 110 controls the duplex mode selection switch 160 to connect the TDD switch 150 with the LNA 178 regardless of a transmission mode or a receiving mode. In a transmission mode of the TDD mode, the controller 110 applies gate biases to the pre-drive amplifier 120, the drive amplifier 130, and the main amplifier 140, and accordingly the amplifiers 120, 130, and 140 amplify a transmission signal. In the TDD mode, the controller 110 controls the TDD switch 150 to transfer a signal from the main amplifier 140 to the BPF 172 in a transmission mode. Such control forms a transmission path 410. In a receiving mode of the TDD mode, the controller 110 does not apply the gate biases to the amplifiers 120, 130, and 140 so that the amplifiers 120, 130, and 140 stop amplifying operation of the transmission signal. In a receiving mode of the TDD mode, the controller 110 controls the TDD switch 150 to transfer a signal from the BPF 172 to the duplex mode selection switch. Such control forms a receiving path 420.

Figure 5:
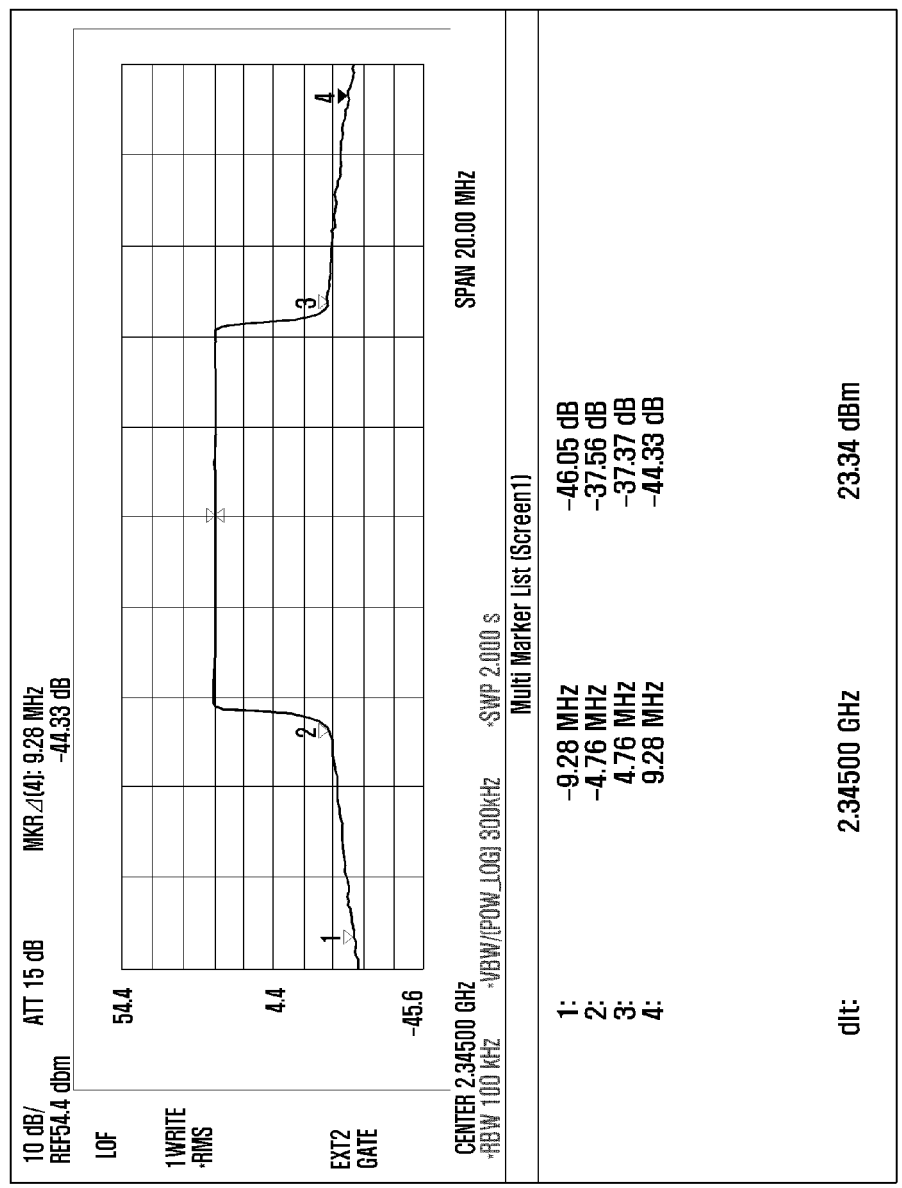
FIG. 5 is a graph illustrating an Adjacent Channel Leakage Ratio (ACLR) characteristic when an HPA using a gate bias without temperature compensation operates at high temperature (environment temperature of 50?)

FIG. 5 is a graph illustrating an Adjacent Channel Leakage Ratio (ACLR) when an HPA using a gate bias without temperature compensation operates at high temperature (environment temperature 50?).

Figure 7:
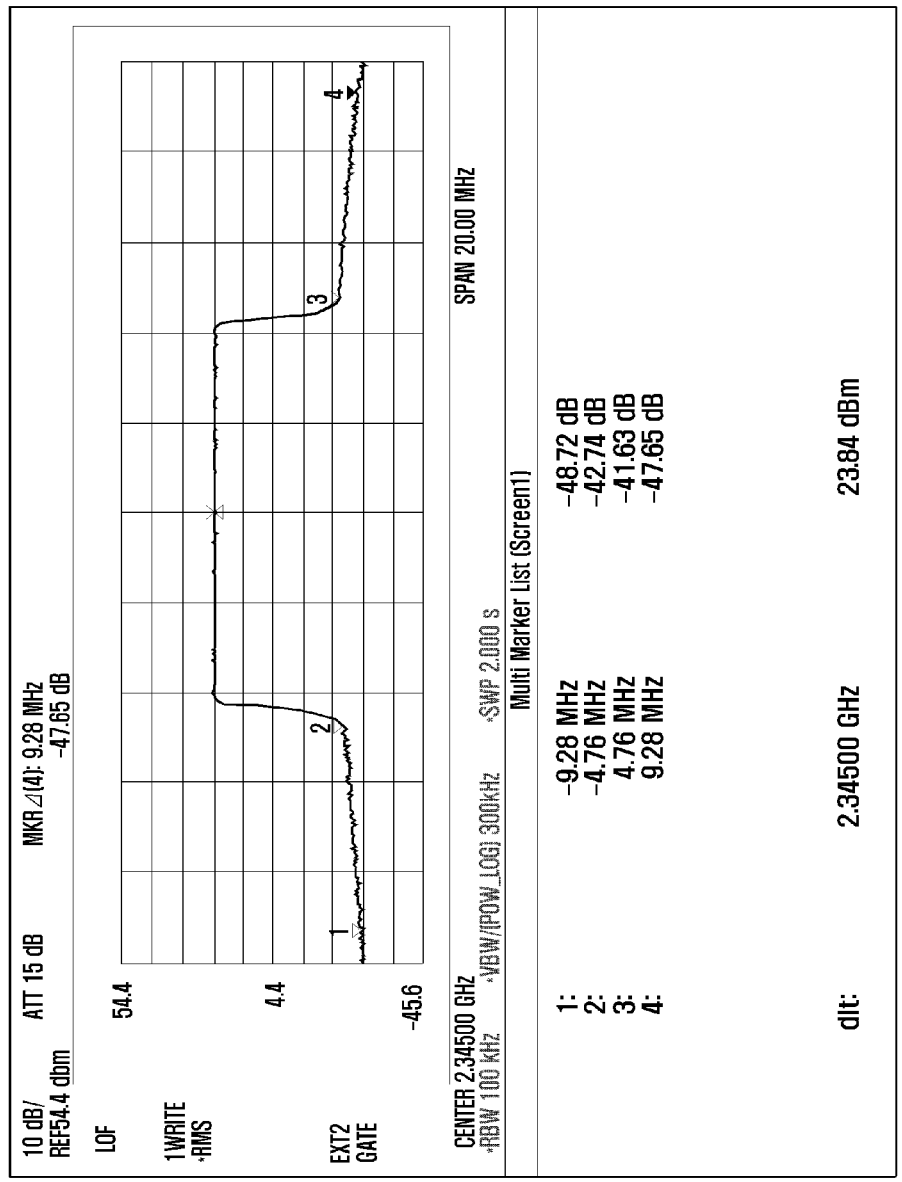
FIG. 7 is a graph illustrating ACLR characteristics when a controller according to the present invention applies a temperature compensation value to apply gate biases to respective amplifiers.

The ACLR characteristic of the HPA 100 at room temperature has an offset frequency of 4.76 MHz to −41 dB. Referring to FIG. 7, it may be appreciated that the ACLR characteristic is further degraded in comparison with a case of room temperature by greater than 4 dB. That is a phenomenon occurring because a gate bias having an optimal characteristic at high temperature differs from that at room temperature, which can not satisfy determined requirements of the HPA 100 at specific environmental temperature. In order to prevent the phenomenon, an optimal Vgs value according to temperature of the HPA 100 is experimentally searched and stored in a table. Subsequently, the controller 110 senses temperature to use an optimal gate bias corresponding thereto such that the HPA 100 may obtain optimal RF performance in all temperature conditions.

Figure 6:
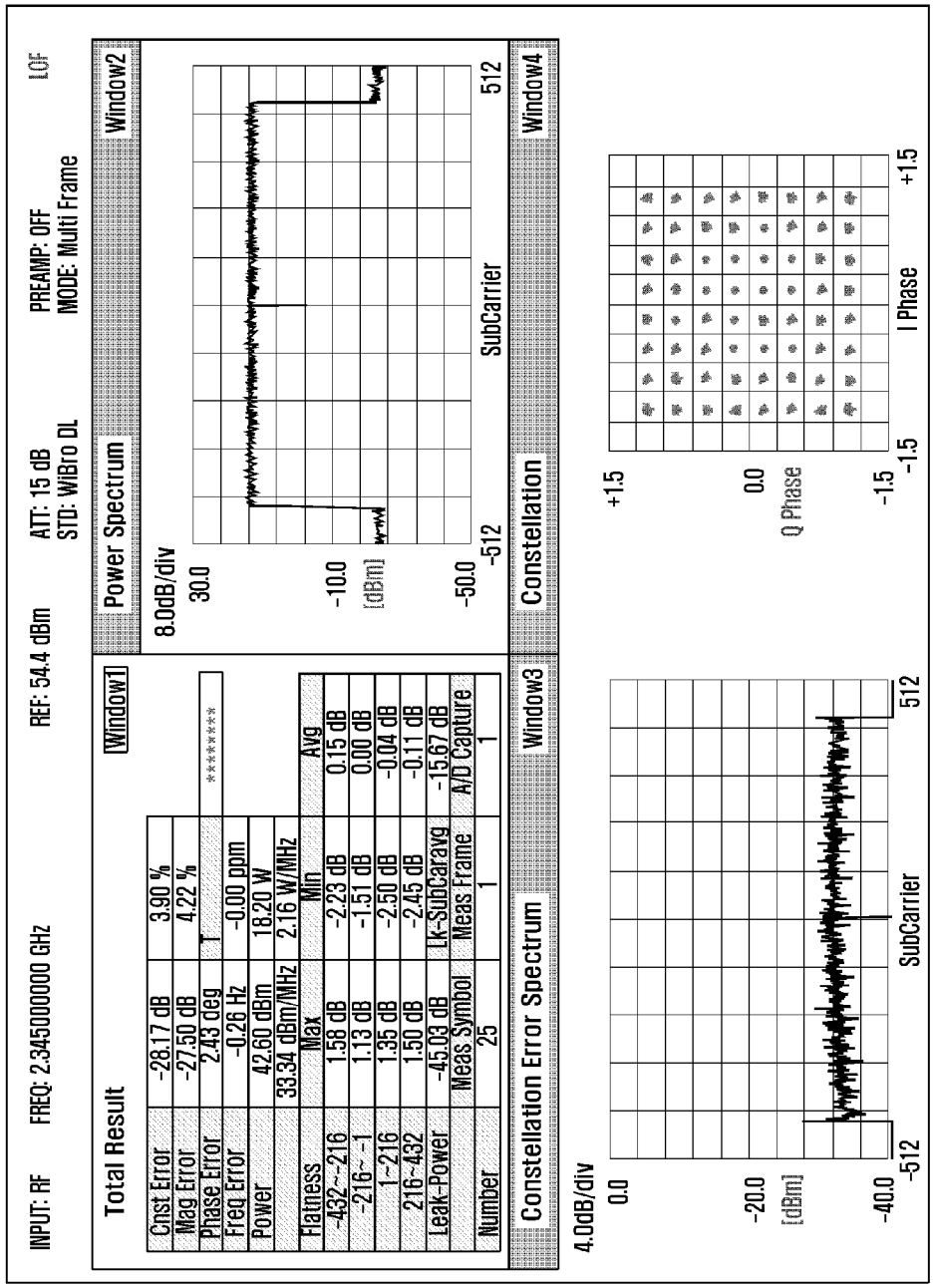
FIG. 6 is a graph illustrating a result measuring constellation error by a measuring device when an HPA operates at high temperature using a fixed gate bias shown in FIG. 5.

FIG. 6 is a graph illustrating a result measuring constellation error (indicated as Cnst Error in FIG. 6) by a measuring device when an HPA 100 operates at high temperature using a fixed gate bias shown in FIG. 5. A constellation error of the HPA 100 is equal to or greater than −37 dB at room temperature. However, a measuring value in a high temperature state is approximately −28 dB, which does not satisfy the specification. For this reason, temperature compensation is essential in the HPA 100. Since the controller 110 may perform an operation of a conventional temperature compensation circuit, it may have optimal performance according to temperature of the HPA without an additional temperature circuit.

FIG. 7 is a graph illustrating ACLR characteristic when a controller applies a temperature compensation value to apply gate biases of respective amplifiers. The ACLR characteristic has approximately −41 dB at 4.76 MHz. This may indicate that temperature compensation is achieved with a numerical value corresponding to characteristics at room temperature to have the same value as that in room temperature without degrading ACLR characteristic degradation.

Figure 8:
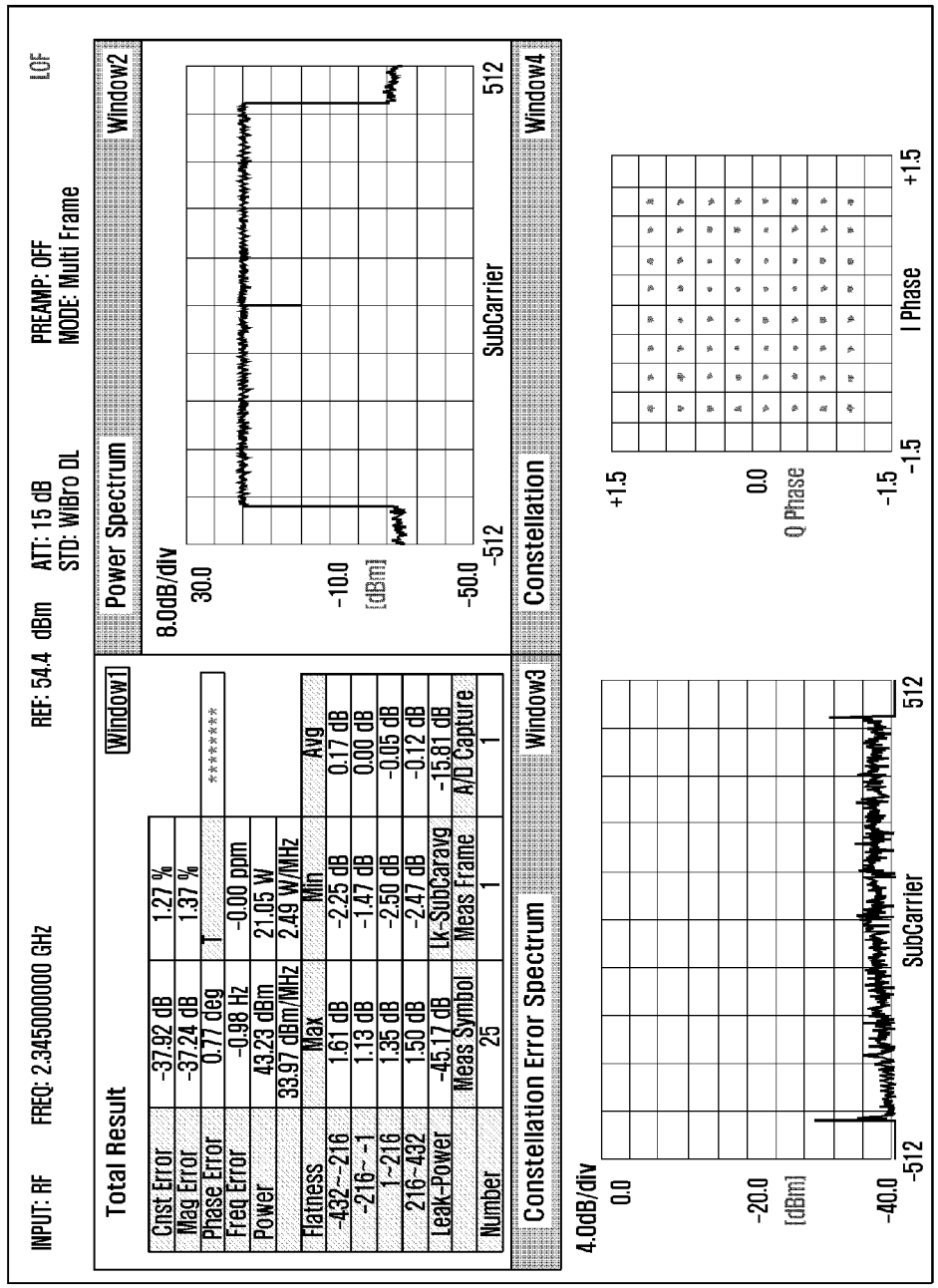
FIG. 8 is a graph illustrating a constellation error at high temperature when the controller applies a temperature compensation value to Vgs.

FIG. 8 is a graph illustrating a constellation error (indicated as Cnst Error in FIG. 8) at high temperature when the controller applies a temperature compensation value to Vgs. The constellation error of FIG. 8 is equal to or greater than −37 dB, which is more excellent than −28 dB being the constellation error of FIG. 6, namely, is improved by greater than approximately 9 dB. Accordingly, the HPA 100 has a constellation error at high temperature similar to that at room temperature to satisfy the specification.

Since computer program instructions may be mounted in a processor of a universal computer, a special computer or other programmable data processing equipment, instructions performed through a processor of a computer or other programmable data processing equipment generates means for performing functions described in block(s) of the flowcharts. Since the computer program instructions may be stored in a computer available or computer readable memory capable of orienting a computer or other programmable data processing equipment to implement functions in a specific scheme, instructions stored in the computer available or computer readable memory may produce manufacturing articles involving an instruction means executing functions described in block(s) of flowcharts. Because the computer program instructions may be mounted on a computer or other programmable data processing equipment, a series of operation steps are performed in the computer or other programmable data processing equipment to create a process executed by the computer such that instructions performing the computer or other programmable data processing equipment may provide steps for executing functions described in block(s) of flowcharts.

Further, each block may indicate a part of a module, a segment, or a code including at least one executable instruction for executing specific logical function(s). It should be noticed that several execution examples may generate functions described in blocks out of an order. For example, two continuously shown blocks may be simultaneously performed, and the blocks may be performed in a converse order according to corresponding functions.

As used in this embodiment, the term~unit refers to software or a hardware structural element such as FPGA or ASIC, and the~unit perform some roles. However, the~unit is not limited to software or hardware. The~unit can be configured to be stored in an addressable storage medium and to play at least one processor. Accordingly, for example, the~unit includes software structural elements, object-oriented software structural elements, class structural elements, task structural elements, processes, functions, attributes, procedures, subroutines, segments of a program code, drivers, firmware, microcode, circuit, data, database, data structures, tables, arrays, and variables. Functions provided in structural elements and~units may be engaged by the smaller number of structural elements and~units, or may be divided by additional structural elements and~units. Furthermore, structural elements and~units may be implemented to play a device or at least one CPU in a security multimedia card.

INDUSTRIAL APPLICABILITY

While the invention has been shown and described with reference to certain exemplary embodiments thereof, it will be understood by those skilled in the art that various changes in form and details may be made therein without departing from the spirit and scope of the invention as defined in the appended claims and their equivalents.

The invention claimed is:

1. An amplifier operable in a Time Division Duplex (TDD) mode or a Frequency Division Duplex (FDD) mode, comprising:
an amplifying unit configured to amplify and to transfer a transmission path signal to a Time Division Duplex (TDD) switch;
the TDD switch configured to transfer the amplified transmission path signal received from the amplifying unit to a filter unit, and to transfer a first receiving path signal received from the filter unit to a duplex mode selection switch if the amplifier operates in the TDD mode;
the duplex mode selection switch configured to transfer a second receiving path signal received from the filter unit to a receiving side if the amplifier operates in the FDD mode, and to transfer the first receiving path signal transferred by the TDD switch to the receiving side if the amplifier operates in the TDD mode; and
a controller configured to receive a duplex mode selection signal, to control the duplex mode selection switch to connect the filter unit and the receiving side if the received duplex mode selection signal is an FDD mode selection signal, and to control the duplex mode selection switch to connect the TDD switch and the receiving side if the received duplex mode selection signal is a TDD mode selection signal.

2. The amplifier of claim 1, wherein the filter unit comprises a band pass filter,
the controller is further configured to receive a TDD signal if the duplex mode selection signal is the TDD mode selection signal, and
the controller is further configured to control the amplifying unit to perform an amplifying operation if the received TDD signal is a transmission mode signal, and to control the TDD switch to transfer the amplified transmission path signal from the amplifying unit to the band pass filter.

3. The amplifier of claim 2, wherein the controller is further configured to control the amplifier unit not to perform the amplifying operation if the received TDD signal is a receiving mode signal, and to control the TDD switch to transfer the first receiving path signal from the band pass filter to the receiving side.

4. The amplifier of claim 3, wherein the filter unit comprises a duplexer, the controller is further configured to control the amplifier unit to perform the amplifying operation if the received duplex mode section signal is the FDD mode selection signal, and to control the TDD switch to transfer the amplified transmission path signal from the amplifying unit to the duplexer.

5. The amplifier of claim 1, wherein the controller is further configured to apply a bias to a gate bias circuit of the amplifying unit.

6. The amplifier of claim 5, wherein the controller is further configured to store a bias value corresponding to temperature, to sense the temperature, to extract a bias value corresponding to the sensed temperature, and to apply a bias corresponding to the extracted bias value to the gate bias circuit of the amplifying unit.

7. The amplifier of claim 1, wherein the filter unit comprises a band pass filter and a duplexer,
the amplifier further comprises an input/output switch to connect the amplifier to one of the band pass filter or the duplexer, and
the controller is further configured to control the amplifier to be connected with the band pass filter if the received duplex mode selection signal is the TDD mode selection signal, and the amplifier to be connected with the duplexer if the duplex mode selection signal is the FDD mode selection signal.

8. A method by an amplifier operable in a Time Division Duplex (TDD) mode or a Frequency Division Duplex (FDD) mode, the method comprising:
amplifying and transferring a transmission path signal received from an amplifying unit through a TDD switch to a filter unit;
receiving a duplex mode selection signal from a system;
connecting a receiving side with the filter unit if the received duplex mode selection signal is an FDD mode selection signal so that a second receiving path signal received from the filter unit is transferred through a duplex mode selection switch to the receiving side; and
connecting the receiving side to the TDD switch if the received duplex mode selection signal is a TDD mode selection signal so that a first receiving path signal received from the filter unit is transferred through the TDD switch and the duplex mode selection switch to the receiving side.

9. The method of claim 8, wherein the filter unit comprises a band pass filter,
the method further comprises:
receiving a TDD signal if the received duplex mode selection signal is the TDD mode selection signal; and
performing an amplifying operation by the amplifying unit and transferring the transmission path signal from the amplifying unit to the band pass filter by the TDD switch if the received TDD signal is a transmission mode signal.

10. The method of claim 9, further comprising controlling the amplifying unit not to perform the amplifying operation and controlling the TDD switch to transfer the first receiving path signal from the band pass filter to the receiving side if the received TDD signal is a receiving mode signal.

11. The method of claim 10, wherein the filter unit comprising a duplexer,
the method further comprises controlling the amplifying unit to perform the amplifying operation and the TDD switch to transfer a signal from the amplifying unit to the duplexer if the received duplex mode selection signal is the FDD mode selection signal.

12. The method of claim 8, wherein an amplifying unit performs an amplifying operation in such a way that a bias is applied to a gate bias circuit of the amplifying unit.

13. The method of claim 12, further comprising:
storing bias values corresponding to temperature; and
sensing temperature, extracting a bias value corresponding to the sensed temperature, and applying a bias corresponding to the extracted bias value to a gate bias circuit of the amplifying unit.

14. The method of claim 8, wherein the filter unit comprises a band pass filter and a duplexer,
the amplifier further comprises an input/output switch to connect the amplifier to one of the duplexer or the band pass filter,
the method further comprises controlling the amplifier to be connected with the band pass filter if the received duplex mode selection signal is the TDD mode selection signal, and controlling the amplifier to be connected with the duplexer if the received duplex mode selection signal is the FDD mode selection signal.

15. An amplifier system comprising a controller for controlling an amplifier, the controller comprising:
an interface unit configured to receive a duplex mode selection signal from a system;
a control unit configured to control a duplex mode selection switch to connect a filter unit and a receiving side, if the received duplex mode selection signal is a Frequency Division Duplex (FDD) mode selection signal, and to control the duplex mode selection switch to connect a Time Division Duplex (TDD) switch and the receiving side if the received duplex mode selection signal is a TDD mode selection signal.

16. The amplifier system of claim 15, wherein the filter unit comprises a band pass filter and a duplexer, and the amplifier comprises an input/output switch to connect the amplifier to one of the duplexer or the band pass filter, and
wherein the controller is further configured to control the amplifier to be connected with the band pass filter if the received duplex mode selection signal is the TDD mode selection signal, and to control the amplifier to be connected with the duplexer if the received duplex mode selection signal is the FDD mode selection signal.

* * * * *